United States Patent
Chen

(10) Patent No.: US 8,973,258 B2
(45) Date of Patent: Mar. 10, 2015

(54) MANUFACTURING METHOD OF SUBSTRATE STRUCTURE

(75) Inventor: Ching-Sheng Chen, Hsinchu County (TW)

(73) Assignee: Subtron Technology Co., Ltd., Hsinchu County (TW)

(*) Notice: Subject to any disclaimer, the term of this patent is extended or adjusted under 35 U.S.C. 154(b) by 245 days.

(21) Appl. No.: 13/600,222

(22) Filed: Aug. 31, 2012

(65) Prior Publication Data

US 2014/0000109 A1 Jan. 2, 2014

(30) Foreign Application Priority Data

Jul. 2, 2012 (TW) .............................. 101123724 A

(51) Int. Cl.
*H05K 3/20* (2006.01)
(52) U.S. Cl.
USPC ................... 29/831; 29/841; 29/846; 29/854; 257/E23.169; 361/742; 361/749; 361/751; 361/804; 438/694
(58) Field of Classification Search
USPC ........... 29/829, 831, 832, 841, 846, 848, 851, 29/855, 858, 885; 257/E23.169; 361/742, 361/749–751, 804; 438/694
See application file for complete search history.

(56) References Cited

U.S. PATENT DOCUMENTS

| | | | | |
|---|---|---|---|---|
| 6,709,980 B2 * | 3/2004 | Gleason | ......................... | 438/678 |
| 7,410,698 B2 * | 8/2008 | Ishida et al. | .................. | 428/403 |
| 7,622,377 B2 * | 11/2009 | Lee et al. | ....................... | 438/612 |
| 2001/0020739 A1 * | 9/2001 | Honda | ........................... | 257/684 |
| 2005/0150683 A1 * | 7/2005 | Farnworth et al. | ............ | 174/255 |
| 2010/0102447 A1 * | 4/2010 | Huang et al. | ................... | 257/738 |
| 2012/0181067 A1 * | 7/2012 | Wen et al. | ...................... | 174/252 |

FOREIGN PATENT DOCUMENTS

| | | |
|---|---|---|
| TW | 200849533 | 12/2008 |
| TW | 200910552 | 3/2009 |
| TW | 201021183 | 6/2010 |

OTHER PUBLICATIONS

"Office Action of Taiwan Counterpart Application", issued on Jan. 22, 2014, p. 1-p. 7.

* cited by examiner

*Primary Examiner* — Paul D Kim
(74) *Attorney, Agent, or Firm* — Jianq Chyun IP Office

(57) ABSTRACT

A manufacturing method of substrate structure is provided. A base material having a core layer, a first patterned copper layer, a second patterned copper layer and at least one conductive via is provided. The first and second patterned copper layers are respectively located on a first surface and a second surface of the core layer. The conductive via passes through the core layer and connects the first and second patterned copper layers. A first and a second solder mask layers are respectively formed on the first and second surfaces. Portions of the first and second patterned copper layers are exposed by the first and second solder mask layers, respectively. A first gold layer is formed on the first and second patterned copper layers exposed by the first and second solder mask layers. A nickel layer and a second gold layer are successively formed on the first gold layer.

7 Claims, 3 Drawing Sheets

MANUFACTURING METHOD OF SUBSTRATE STRUCTURE

CROSS-REFERENCE TO RELATED APPLICATION

This application claims the priority benefit of Taiwan application serial no. 101123724, filed on Jul. 2, 2012. The entirety of the above-mentioned patent application is hereby incorporated by reference herein and made a part of this specification.

BACKGROUND OF THE INVENTION

1. Field of the Invention

The invention relates to a manufacturing method of a substrate structure, and more particularly to a manufacturing method of a substrate structure having a more preferable process yield rate.

2. Description of Related Art

Packaging of integrated circuit is an important step in the back-end process for manufacturing a semiconductor, the purpose thereof is to protect each chip after manufacturing process and to electrically connect the pads of the chip and printed circuit board (PCBs). The PCBs and chip carrier substrates have multiple solder joints, a process of surface finishing or metallization need to be performed on a contact surface between the solder joints and circuit layers of the PCBs or the chip carrier substrates before soldering. Generally, a double metal layer of Ni/Pd or Ni/Au, or a triple metal layer of Ni/Pd/Au may be formed on the pads of the circuit layer.

Presently, copper is mostly used as the material for the pads of the circuit layer, and a method for forming nickel layer on the pads is electroless plating (also known as chemical plating). Since the nickel layer contains component of boron or phosphorus (i.e. Ni—P or Ni—B), which may affect integrity of the microwaves communication signals, such affection is quite obvious especially when the product is used in high frequency. Furthermore, since the nickel layer is formed by chemical plating (i.e. nickel-plating with a reduction method), problems such as unstable electroplating solution and incomplete coverage of the nickel layer may occur, thereby causing a skip plating problem in the following chemical plating process for palladium-plating. Moreover, since gas (such as hydrogen) may be generated during an initial process of the electroless plating, if a thickness of the nickel layer newly formed is relatively thin, a void may be generated, or metal oxide or non-metal having impurities with higher hardness may be formed on the surface. Therefore, the thickness of the nickel layer formed by chemical plating usually requires an accumulation until it reached a certain thickness (e.g. more than 15 μm). However, the nickel layer with such thickness may cause a problem of insufficient space when being used in the products with smaller circuit gaps.

SUMMARY OF THE INVENTION

The invention provides a method for manufacturing a substrate structure, a first gold layer, a nickel layer and a second gold layer are successively formed on the patterned copper layers thereof, said method not only provides a more preferable process yield rate, but also maintains integrity of the microwaves communication signals.

The invention provides a manufacturing method of a substrate structure, including the following steps. A base material is provided. The base material has a core layer, a first patterned copper layer, a second patterned copper layer and at least one conductive via. The core layer has a first surface and a second surface opposite to each other. The first patterned copper layer and the second patterned copper layer are respectively located on the first surface and the second surface. The conductive via passes through the core layer and connects the first and second copper layers. A first and a second solder mask layers are respectively formed on the first surface and the second surface on the core layer. A portion of the first patterned copper layer and a portion of the second patterned copper layer are exposed by the first and second solder mask layers, respectively. A first gold layer is formed on the first and second patterned copper layers exposed by the first and second solder mask layers. A nickel layer is formed on the first gold layer. A second gold layer is formed on the nickel layer.

According to an embodiment of the invention, the method of forming the first gold layer includes an immersion plating.

According to an embodiment of the invention, a thickness of the first gold layer is between 0.02 and 0.05 micrometers.

In an embodiment of the invention, a method of forming the nickel layer includes a reduction reaction.

According to an embodiment of the invention, a thickness of the nickel layer is between 0.1 and 5 micrometers.

According to an embodiment of the invention, the method of forming the second gold layer includes an immersion plating.

According to an embodiment of the invention, a thickness of the second gold layer is between 0.02 and 0.2 micrometers.

According to an embodiment of the invention, the base material has at least one through hole. The through hole passes through the first patterned copper layer, the core layer and the second patterned copper layer, and the first gold layer cover an inner wall of the through hole.

In view of above, the substrate structure of the invention is manufactured by forming the first gold layer, the nickel layer and the second gold layer successively on the patterned copper layers. In comparing with the method for forming the nickel layer, the palladium layer and the gold layer successively on a patterned copper layer of the conventional substrate structure, the manufacturing method of the substrate structure of the invention not only provides a more preferable process yield rate, but also maintains integrity of the microwaves communication signals.

To make the above features and advantages of the invention more comprehensible, several embodiments accompanied with drawings are described in detail as follows.

DESCRIPTION OF THE EMBODIMENTS

Figure 1A:
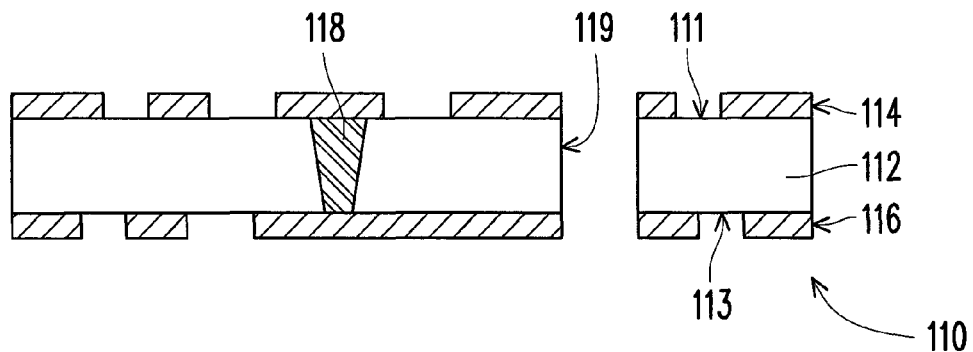
FIG. 1A to FIG. 1E are schematic cross-sectional views illustrating a manufacturing method of a substrate structure according to an embodiment of the invention.

FIG. 1A to FIG. 1E are schematic cross-sectional views illustrating a manufacturing method of a substrate structure according to an embodiment of the invention. Referring to FIG. 1A, according to the manufacturing method of a substrate structure in this embodiment, a base material 110 is provided. More specifically, the base material 110 has a core layer 112, a first patterned copper layer 114, a second patterned copper layer 116 and at least one conductive via 118 (only one conductive via is schematically illustrated in FIG. 1A). The core layer 112 has a first surface 111 and a second surface 113 opposite to each other. The first patterned copper layer 114 and the second patterned copper layer 116 are respectively located on the first surface 111 and the second surface 113. The conductive via 118 passes through the core layer 112 and connects the first patterned copper layer 114 and the second patterned copper layer 116. In addition, the base material 110 according to the present embodiment further includes at least one through hole 119 (only one through hole is schematically in FIG. 1A), in which the through hole 119 passes through the first patterned copper layer 114, the core layer 223 and the second patterned copper layer 116.

Figure 1B:
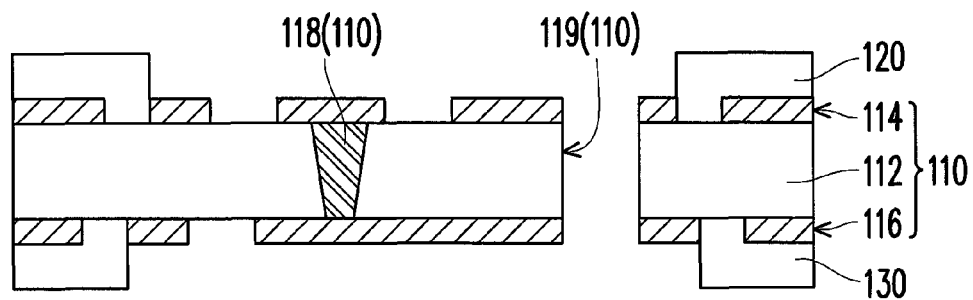

Next, referring to FIG. 1B, a first solder mask layer 120 and a second solder mask layer 130 are respectively formed on the first surface 111 and the second surface 114 of the core layer 112. In this case, a portion of the first patterned copper layer 114 and a portion of the second patterned copper layer 116 are exposed by the first solder mask layer 120 and the second solder mask 130, in which the portion of the first patterned copper layer 114 and the portion of the second patterned copper layer 116 exposed by the first solder mask layer 120 and the second solder mask 130 may be defined as a plurality of pads.

Figure 1C:
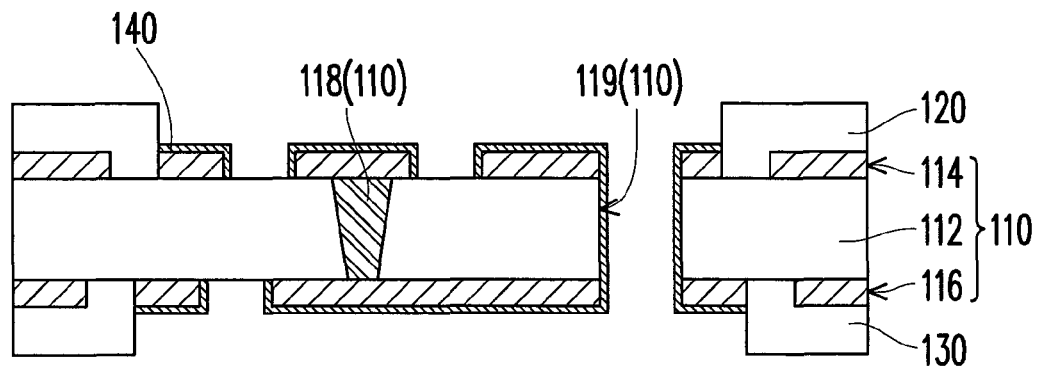

Next, referring to FIG. 1C, a first gold layer 140 is formed on the first patterned copper layer 114 and the second patterned copper layer 116 exposed by the first solder mask layer 120 and the second solder mask layer 130. Herein, the first gold layer 140 completely covers the first patterned copper layer 114 and the second patterned copper layer 116 exposed by the first solder mask layer 120 and the second solder mask layer 130, and the first gold layer 140 covers an inner wall of the through hole 119. In this case, the first gold layer 140 is a refined gold layer without containing the component of boron or phosphorus. The method for forming the first gold layer 140 according to the present embodiment may be, for example, an immersion plating (also known as displacement plating), and a thickness of the first gold layer 140 may be, for example, between 0.02 μm to 0.05 μm.

Figure 1D:
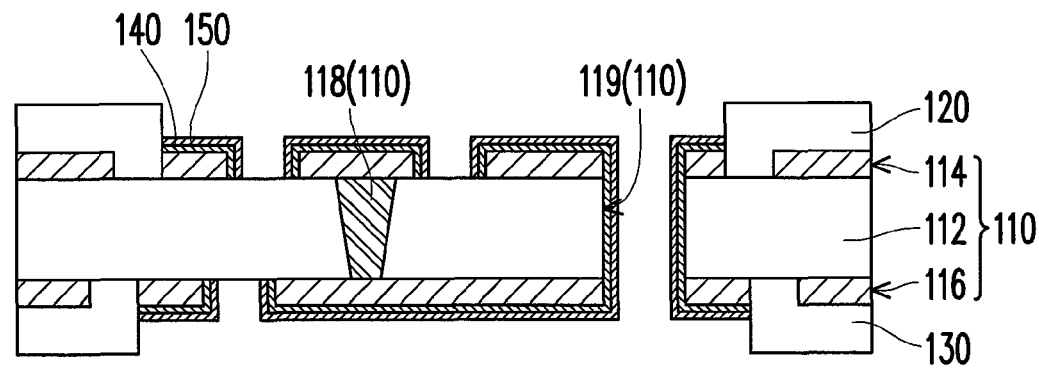

Next, referring to FIG. 1D, a nickel layer 150 is formed on the first gold layer 140, in which the nickel layer 150 completely covers the first gold layer 140. In the present embodiment, a method for forming the nickel layer 150 may be, for example, a reduction reaction. A thickness of the nickel layer 150 may be, for example, between 0.1 μm to 5 μm.

Figure 1E:
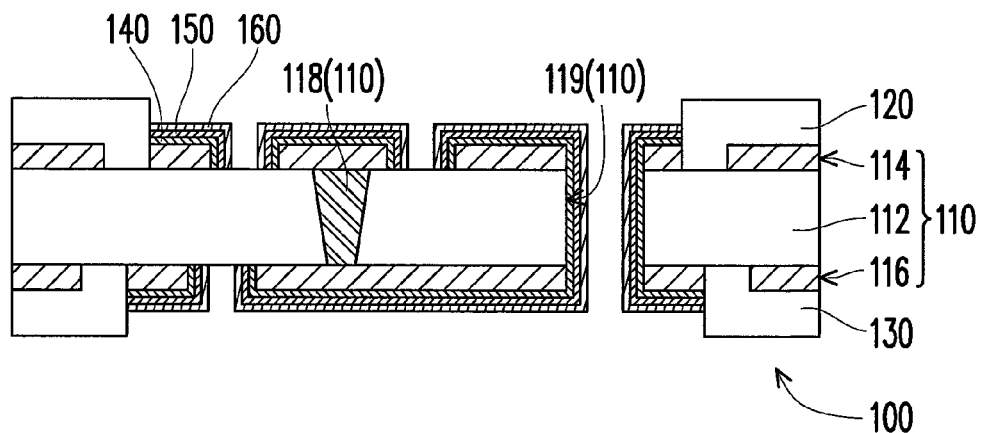

Lastly, referring to FIG. 1E, a second gold layer 160 is formed on the nickel layer 150, in which the second gold layer 160 completely covers the nickel layer 150. In this case, the second gold layer 160 is a refined gold layer without containing the component of boron or phosphorus. The method for forming the second gold layer 160 according to the present embodiment may be, for example, an immersion plating (also known as displacement plating). A thickness of the second gold layer 160 may be, for example, between 0.02 μm to 0.2 μm. So far, the substrate structure 100 is completely formed.

In the present embodiment, the first gold layer 140, the nickel layer 150 and the second gold layer 160 are successively formed on the first patterned copper layer 114 and the second patterned copper layer 116 exposed by the first solder mask layer 120 and the second solder mask layer 130. Thus, in comparing to a method for forming the nickel layer, the palladium layer and the gold layer successively on the pads of the conventional substrate structure, the first gold layer 140 is a refined gold layer without containing the component of boron or phosphorus. Therefore, integrity of the microwaves communication signals may be maintained without getting affected. Moreover, since the first gold layer 140 is formed using a method of immersion plating (also known as displacement plating) in the present embodiment, in which the immersion plating is relatively stable in comparing to method of electroless plating and integrity of plating-layer coverage is more preferable in the following process, thereby providing a more preferable process yield rate. In addition, a thickness of the gold layer 140 is relatively smaller than that of the conventional nickel layer, which is applicable on the products having smaller space in circuit.

In view of above, the substrate structure of the invention is manufactured by forming the first gold layer, the nickel layer and the second gold layer successively on the patterned copper layers. In comparing with the method for forming the nickel layer, the palladium layer and the gold layer successively on a patterned copper layer of the conventional substrate structure, the manufacturing method of the substrate structure of the invention not only provides a more preferable process yield rate, but also maintains integrity of the microwaves communication signals.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed:

1. A manufacturing method of a substrate structure, comprising:

providing a base material, the base material has a core layer, a first patterned copper layer, a second patterned copper layer and at least one of a conductive via, wherein the core layer has a first surface and a second surface opposite to each other, the first patterned copper layer and the second patterned copper layer are respectively located on the first surface and the second surface, and the conductive via passes through the core layer and connects the first patterned copper layer and the second patterned copper layer;

respectively forming a first solder mask layer and a second solder mask layer on the first surface and the second surface on the core layer, wherein a portion of the first patterned copper layer and a portion of the second patterned copper layer are exposed by the first solder mask layer and the second solder mask;

forming a first gold layer on the first patterned copper layer and the second patterned copper layer exposed by the first solder mask layer and the second solder mask layer, wherein the base material further comprises at least one through hole, the through hole passes through the first patterned copper layer, the core layer and the second patterned copper layer, and the first gold layer covers an inner wall of the through hole;

forming a nickel layer on the first gold layer; and forming a second gold layer on the nickel layer.

2. The manufacturing method of the substrate structure as recited in claim 1, wherein a method for forming the first gold layer comprises an immersion plating.

3. The manufacturing method of the substrate structure as recited in claim 1, wherein a thickness of the first gold layer is between 0.02 μm to 0.05 μm.

4. The manufacturing method of the substrate structure as recited in claim 1, wherein a method for forming the nickel layer comprises a reduction reaction.

5. The manufacturing method of the substrate structure as recited in claim 1, wherein a thickness of the nickel layer is between 0.1 μm to 5 μm.

6. The manufacturing method of the substrate structure as recited in claim 1, wherein a method for forming the second gold layer comprises an immersion plating.

7. The manufacturing method of the substrate structure as recited in claim 1, wherein a thickness of the second gold layer is between 0.02 μm to 0.2 μm.

* * * * *